United States Patent
Li

(10) Patent No.: US 10,769,018 B2
(45) Date of Patent: Sep. 8, 2020

(54) SYSTEM AND METHOD FOR HANDLING UNCORRECTABLE DATA ERRORS IN HIGH-CAPACITY STORAGE

(71) Applicant: Alibaba Group Holding Limited, George Town, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 16/209,319

(22) Filed: Dec. 4, 2018

(65) Prior Publication Data
US 2020/0174886 A1   Jun. 4, 2020

(51) Int. Cl.
| | |
|---|---|
| G11C 29/00 | (2006.01) |
| G06F 11/14 | (2006.01) |
| G06F 11/10 | (2006.01) |
| G11C 29/42 | (2006.01) |
| G11C 29/44 | (2006.01) |
| G06F 3/06 | (2006.01) |
| G06F 12/02 | (2006.01) |
| G11C 29/52 | (2006.01) |

(52) U.S. Cl.
CPC .......... *G06F 11/141* (2013.01); *G06F 3/0619* (2013.01); *G06F 3/0631* (2013.01); *G06F 3/0688* (2013.01); *G06F 11/108* (2013.01); *G06F 12/0246* (2013.01); *G11C 29/42* (2013.01); *G11C 29/44* (2013.01); *G11C 29/52* (2013.01); *G06F 2212/7201* (2013.01)

(58) Field of Classification Search
CPC .... G06F 11/141; G06F 11/108; G06F 3/0619; G06F 3/0688; G06F 3/0631; G11C 29/42; G11C 29/44; G11C 29/52
See application file for complete search history.

(56) References Cited

U.S. PATENT DOCUMENTS

| | | |
|---|---|---|
| 4,775,932 A | 10/1988 | Oxley |
| 5,930,167 A | 7/1999 | Lee |
| 6,148,377 A | 11/2000 | Carter |

(Continued)

FOREIGN PATENT DOCUMENTS

| | | |
|---|---|---|
| JP | 2003022209 | 1/2003 |
| JP | 2011175422 | 9/2011 |

(Continued)

OTHER PUBLICATIONS

Tsuchiya, Yoshihiro et al. "DBLK: Deduplication for Primary Block Storage", MSST 2011, Denver, CO, May 23-27, 2011 pp. 1-5.

(Continued)

*Primary Examiner* — Samir W Rizk
(74) *Attorney, Agent, or Firm* — Shun Yao; Park, Vaughan, Fleming & Dowler LLP

(57) ABSTRACT

One embodiment described herein provides a method and system for handling errors in a storage system. During operation a data-placement module of the storage system detects an error occurring at a first physical location within the storage system. In response to determining that the error occurs during a write access, the system writes to-be-written data into a second physical location within the storage system, and updates a mapping between a logical address and a physical address associated with the to-be-written data.

17 Claims, 10 Drawing Sheets

(56) References Cited

U.S. PATENT DOCUMENTS

| | | |
|---|---|---|
| 6,226,650 B1 | 5/2001 | Mahajan et al. |
| 7,565,454 B2 | 7/2009 | Zuberi |
| 7,958,433 B1 | 6/2011 | Yoon |
| 8,085,569 B2 | 12/2011 | Kim |
| 8,144,512 B2 | 3/2012 | Huang |
| 8,166,233 B2 | 4/2012 | Schibilla |
| 8,260,924 B2 | 9/2012 | Koretz |
| 8,281,061 B2 | 10/2012 | Radke |
| 8,452,819 B1 | 5/2013 | Sorenson, III |
| 8,516,284 B2 | 8/2013 | Chan |
| 8,751,763 B1 | 6/2014 | Ramarao |
| 8,825,937 B2 | 9/2014 | Atkisson |
| 9,043,545 B2 | 5/2015 | Kimmel |
| 9,088,300 B1 | 7/2015 | Chen |
| 9,092,223 B1 | 7/2015 | Pani |
| 9,280,472 B1 | 3/2016 | Dang |
| 9,280,487 B2 | 3/2016 | Candelaria |
| 9,529,601 B1 | 12/2016 | Dharmadhikari |
| 9,588,698 B1 | 3/2017 | Karamcheti |
| 9,588,977 B1 | 3/2017 | Wang |
| 1,001,316 A1 | 7/2018 | Fisher |
| 1,022,973 A1 | 3/2019 | Natarajan |
| 1,023,519 A1 | 3/2019 | Qiu |
| 2002/0010783 A1 | 1/2002 | Primak |
| 2002/0073358 A1 | 6/2002 | Atkinson |
| 2002/0161890 A1 | 10/2002 | Chen |
| 2003/0163594 A1 | 8/2003 | Aasheim |
| 2003/0163633 A1 | 8/2003 | Aasheim |
| 2004/0010545 A1 | 1/2004 | Pandya |
| 2004/0255171 A1 | 12/2004 | Zimmer |
| 2004/0268278 A1 | 12/2004 | Hoberman |
| 2005/0038954 A1 | 2/2005 | Saliba |
| 2005/0097126 A1 | 5/2005 | Cabrera |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0156012 A1 | 7/2006 | Beeson |
| 2007/0033323 A1 | 2/2007 | Gorobets |
| 2007/0061502 A1 | 3/2007 | Lasser |
| 2007/0101096 A1 | 5/2007 | Gorobets |
| 2007/0283081 A1 | 12/2007 | Lasser |
| 2007/0285980 A1 | 12/2007 | Shimizu |
| 2008/0034154 A1 | 2/2008 | Lee |
| 2008/0112238 A1 | 5/2008 | Kim |
| 2008/0301532 A1 | 12/2008 | Uchikawa |
| 2009/0113219 A1 | 4/2009 | Aharonov |
| 2009/0282275 A1 | 11/2009 | Yermalayeu |
| 2009/0307249 A1 | 12/2009 | Koifman |
| 2009/0310412 A1 | 12/2009 | Jang |
| 2010/0169470 A1 | 7/2010 | Takashige |
| 2010/0229224 A1 | 9/2010 | Etchegoyen |
| 2010/0325367 A1 | 12/2010 | Kornegay |
| 2011/0055458 A1 | 3/2011 | Kuehne |
| 2011/0055471 A1 | 3/2011 | Thatcher |
| 2011/0099418 A1* | 4/2011 | Chen .................. G11C 11/5628 714/6.24 |
| 2011/0153903 A1 | 6/2011 | Hinkle |
| 2011/0161784 A1 | 6/2011 | Selinger |
| 2011/0218969 A1 | 9/2011 | Anglin |
| 2011/0231598 A1 | 9/2011 | Hatsuda |
| 2011/0292538 A1 | 12/2011 | Haga |
| 2011/0299317 A1 | 12/2011 | Shaeffer |
| 2011/0302353 A1 | 12/2011 | Confalonieri |
| 2012/0084523 A1 | 4/2012 | Littlefield |
| 2012/0117399 A1 | 5/2012 | Chan |
| 2012/0147021 A1 | 6/2012 | Cheng |
| 2012/0159289 A1 | 6/2012 | Piccirillo |
| 2012/0210095 A1 | 8/2012 | Nellans |
| 2012/0246392 A1 | 9/2012 | Cheon |
| 2012/0278579 A1 | 11/2012 | Goss |
| 2012/0284587 A1 | 11/2012 | Yu |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0166820 A1 | 6/2013 | Batwara |
| 2013/0173845 A1 | 7/2013 | Aslam |
| 2013/0219131 A1 | 8/2013 | Alexandron |
| 2013/0318283 A1 | 11/2013 | Small |
| 2014/0082273 A1 | 3/2014 | Segev |
| 2014/0108414 A1 | 4/2014 | Stillerman |
| 2014/0181532 A1 | 6/2014 | Camp |
| 2014/0233950 A1 | 8/2014 | Luo |
| 2014/0250259 A1 | 9/2014 | Ke |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0082317 A1 | 3/2015 | You |
| 2015/0106556 A1 | 4/2015 | Yu |
| 2015/0106559 A1 | 4/2015 | Cho |
| 2015/0142752 A1 | 5/2015 | Chennamsetty |
| 2015/0227316 A1 | 8/2015 | Warfield |
| 2015/0277937 A1 | 10/2015 | Swanson |
| 2015/0301964 A1 | 10/2015 | Brinicombe |
| 2015/0304108 A1 | 10/2015 | Obukhov |
| 2015/0363271 A1 | 12/2015 | Haustein |
| 2015/0372597 A1 | 12/2015 | Luo |
| 2016/0014039 A1 | 1/2016 | Reddy |
| 2016/0098344 A1 | 4/2016 | Gorobets |
| 2016/0110254 A1 | 4/2016 | Cronie |
| 2016/0179399 A1 | 6/2016 | Melik-Martirosian |
| 2016/0232103 A1 | 8/2016 | Schmisseur |
| 2016/0239074 A1 | 8/2016 | Lee |
| 2016/0239380 A1 | 8/2016 | Wideman |
| 2016/0274636 A1 | 9/2016 | Kim |
| 2016/0306853 A1 | 10/2016 | Sabaa |
| 2016/0343429 A1 | 11/2016 | Nieuwejaar |
| 2016/0350002 A1 | 12/2016 | Vergis |
| 2017/0075583 A1 | 3/2017 | Alexander |
| 2017/0075594 A1 | 3/2017 | Badam |
| 2017/0109232 A1 | 4/2017 | Cha |
| 2017/0147499 A1 | 5/2017 | Mohan |
| 2017/0162235 A1 | 6/2017 | De |
| 2017/0168986 A1 | 6/2017 | Sajeepa |
| 2017/0212708 A1 | 7/2017 | Suhas |
| 2017/0228157 A1 | 8/2017 | Yang |
| 2017/0249162 A1 | 8/2017 | Tsirkin |
| 2017/0262178 A1 | 9/2017 | Hashimoto |
| 2017/0285976 A1 | 10/2017 | Durham |
| 2017/0286311 A1 | 10/2017 | Juenemann |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0088867 A1 | 3/2018 | Kaminaga |
| 2018/0107591 A1 | 4/2018 | Smith |
| 2018/0143780 A1 | 5/2018 | Cho |
| 2018/0167268 A1 | 6/2018 | Liguori et al. |
| 2018/0189182 A1 | 7/2018 | Wang |
| 2018/0270110 A1 | 9/2018 | Chugtu |
| 2018/0293014 A1 | 10/2018 | Ravimohan |
| 2018/0329776 A1 | 11/2018 | Lai |
| 2018/0373428 A1 | 12/2018 | Kan |
| 2019/0012111 A1 | 1/2019 | Li |
| 2019/0073262 A1 | 3/2019 | Chen |
| 2019/0205206 A1 | 7/2019 | Hornung |

FOREIGN PATENT DOCUMENTS

| | | |
|---|---|---|
| WO | 9418634 | 8/1994 |
| WO | 1994018634 | 8/1994 |

OTHER PUBLICATIONS

Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.

(56) References Cited

OTHER PUBLICATIONS

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.
WOW: Wise Ordering for Writes—Combining Spatial and Temporal Locality in Non-Volatile Caches by Gill (Year: 2005).
Helen H. W. Chan et al. "HashKV: Enabling Efficient Updated in KV Storage via Hashing", https://www.usenix.org/conference/atc18/presentation/chan, (Year: 2018).
https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).
Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.
EMC Powerpath Load Balancing and Failover Comparison with native MPIO operating system solutions. Feb. 2011.

\* cited by examiner

SYSTEM AND METHOD FOR HANDLING UNCORRECTABLE DATA ERRORS IN HIGH-CAPACITY STORAGE

BACKGROUND

Field

This disclosure is generally related to data storage devices. More specifically, this disclosure is related to a method and system for handling uncorrectable errors in high-capacity storage devices.

Related Art

Solid-state storage (SSS) is a type of non-volatile storage system that stores and retrieves digital information using electronic circuits. Unlike traditional magnetic storage systems, the SSS devices (e.g., flash drives) do not involve moving mechanical parts and, hence, can be much faster. However, compared with hard-disk drives (HDDs), solid-state drives (SSDs) may suffer from a faster rate of data loss. For example, Not-And (NAND)-flash drives store data as electrical charges, which can leak away relatively quickly in comparison with changes in magnetic domain polarity. This can be due to the imperfect insulation within the structure of the memory itself. As time passes, the data quality deteriorates. As the noise accumulates, the data may eventually become unable to be retrieved, leading to data loss.

Current SSDs have built-in error-correction mechanisms, which attempt to eliminate the occurrence of data loss. More specifically, SSD controllers can implement near-capacity error-correction code (ECC) (e.g., low-density parity code (LDPC)) and advanced data-recovery tools (e.g., redundant array of independent silicon elements (RAISE)). These approaches intend to make data protection as strong as possible in order to reduce the likelihood of data loss. Nevertheless, with the further scale-down of the NAND flash fabrication and the higher gate density, even the strongest ECC and RAISE combination can fail as signal-to-noise ratio (SNR) worsens.

SUMMARY

One embodiment described herein provides a method and system for handling errors in a storage system. During operation a data-placement module of the storage system detects an error occurring at a first physical location within the storage system. In response to determining that the uncorrectable error occurs during a write access, the system writes to-be-written data into a second physical location within the storage system, and updates a mapping between a logical address and a physical address associated with the to-be-written data.

In a variation on this embodiment, the storage system is based on solid-state drives (SSDs), and the SSD-based storage system comprises a plurality of not-and (NAND) flash drives.

In a variation on this embodiment, in response to determining that the uncorrectable error occurs during a read access, the system retrieves a copy of to-be-read data from a second storage system, and serves the read access using the retrieved copy.

In a further variation, in response to determining that the read access belongs to a host process, the system serves the read access by returning the retrieved copy to an application requesting the to-be written data.

In a further variation, in response to determining that the read access belongs to a background process, the system determines a destination physical location associated with the to-be-read data based on a current mapping table, writes dummy data into the destination physical location prior to retrieving the copy, and indicates, by setting a data-incorrect flag, in a mapping table entry associated with the to-be-read data that current data stored at the destination physical location is incorrect.

In a further variation, the background process can include a garbage collection process or a read-disturb handling process.

In a further variation, subsequent to retrieving the copy, the system writes the copy to a second destination physical location, and updates the mapping table entry associated with the to-be-read data using a physical address of the second destination physical location.

In a further variation, the system updates the mapping table entry further comprises unsetting the data-incorrect flag.

In a further variation, subsequent to retrieving the copy, the system repairs a storage drive within the storage system, within which the error occurs, using the retrieved copy without bringing the storage drive offline.

In a variation on this embodiment, detecting the error further comprises: in response to receiving an error correction coding (ECC) error, initiating a data recovery operation; and detecting the error in response to determining that the data recovery operation fails.

One embodiment described herein provides a storage system. The storage system can include a plurality of storage drives and a data-placement module coupled to the storage drives. During operation, the data-placement module can be configured to detect an error occurring at a first physical location within the storage drives. In response to determining that the error occurs during a write access, the data-placement module can write to-be-written data into a second physical location within the storage drives, and can update a mapping between a logical address and a physical address associated with the to-be-written data.

In a variation on this embodiment, the data-placement module resides in a user space, and the data-placement module is further configured to perform one or more of: interfacing with applications to receive to-be-written data, allocating logic extents for the to-be-written data, and mapping the logic extents to physical locations.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present disclosure provide a solution to the technical problem of reducing data errors in solid-state storage (SSS) devices. More specifically, a novel data storage system is developed by implementing a user-space data-placement layer, which takes in application storage requests and maps the data into physical locations in the SSS device. The user-space data-placement layer can immediately detect, report, and fix silent data corruptions online for both the host read/write accesses and background read/write accesses.

Conventional Data-Protection Schemes

Figure 1:
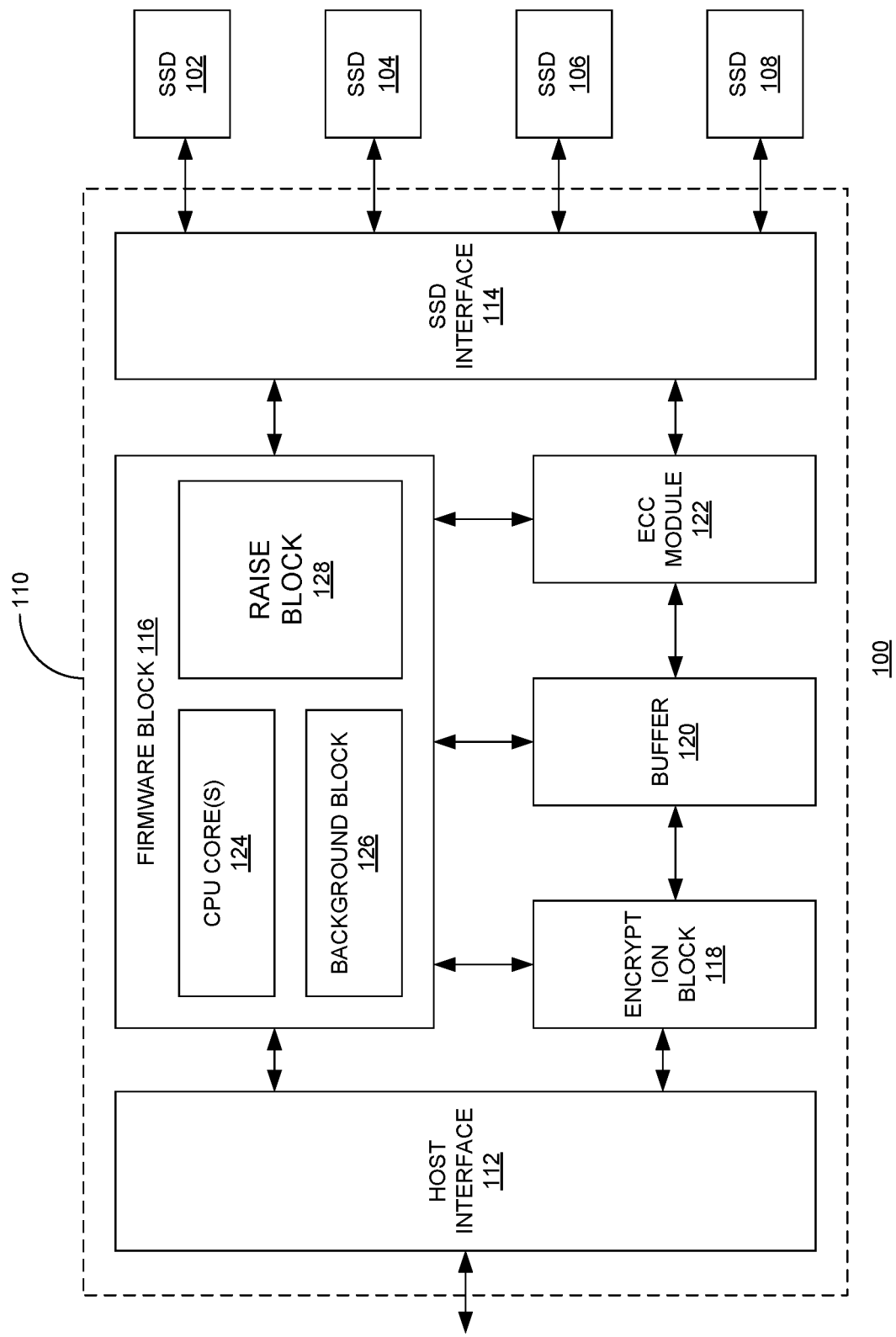
FIG. 1 illustrates the structure of a conventional solid-state storage (SSS) system (prior art).

FIG. 1 illustrates the structure of a conventional solid-state storage (SSS) system (prior art). SSS system 100 can include a number of solid-state drives (SSDs) (e.g., flash drives 102, 104, 106, and 108) and an SSD controller 110. SSD drives 102-108 can include NAND flash drives. SSD controller 110 can include host interface 112 and SSD interface 114. SSD controller 110 can further include a firmware block 116 and a number of hardware-based functional blocks (e.g., encryption block 118, buffer 120, and ECC module 122). Firmware module 116 can include a number of functional blocks, such as CPU core(s) 124; block 126 for handling wear leveling (WL), garbage collection (GC), read disturb, etc.; and RAISE block 128.

As discussed previously, the first line of data protection can be provided by the strong ECC implemented in ECC module 122. In the event of ECC failure, RAISE block 128 can be used to recover data based on the parity built into the data. However, even the combination of strong ECC and RAISE can still fail in certain scenarios, and this conventional approach has a number of shortcomings in error handling.

As one can see in FIG. 1, conventional SSS system 100 lacks an informing mechanism that can timely report to the host detailed information associated with data loss (e.g., the timing and location of the data loss). The host needs to periodically scan the SSD registers to obtain such information, which can be highly abstracted. More specifically, the scanned information may only show that uncorrected errors have happened on the disk without providing more detail. To protect the data, one may need to replace the entire disk drive, thus leading to increased total cost of operation (TCO). Moreover, the data loss is not detected in a timely manner, which can lead to unpredictable and uncontrollable error handling.

Online Error Handling

To improve the error-handling capability, more specifically, to provide the ability to handle silent errors online, in some embodiments, a user-space data-placement layer can be introduced to connect the SSDs with data-storing applications by mapping data-storage requests to physical locations on the SSDs.

Figure 2:
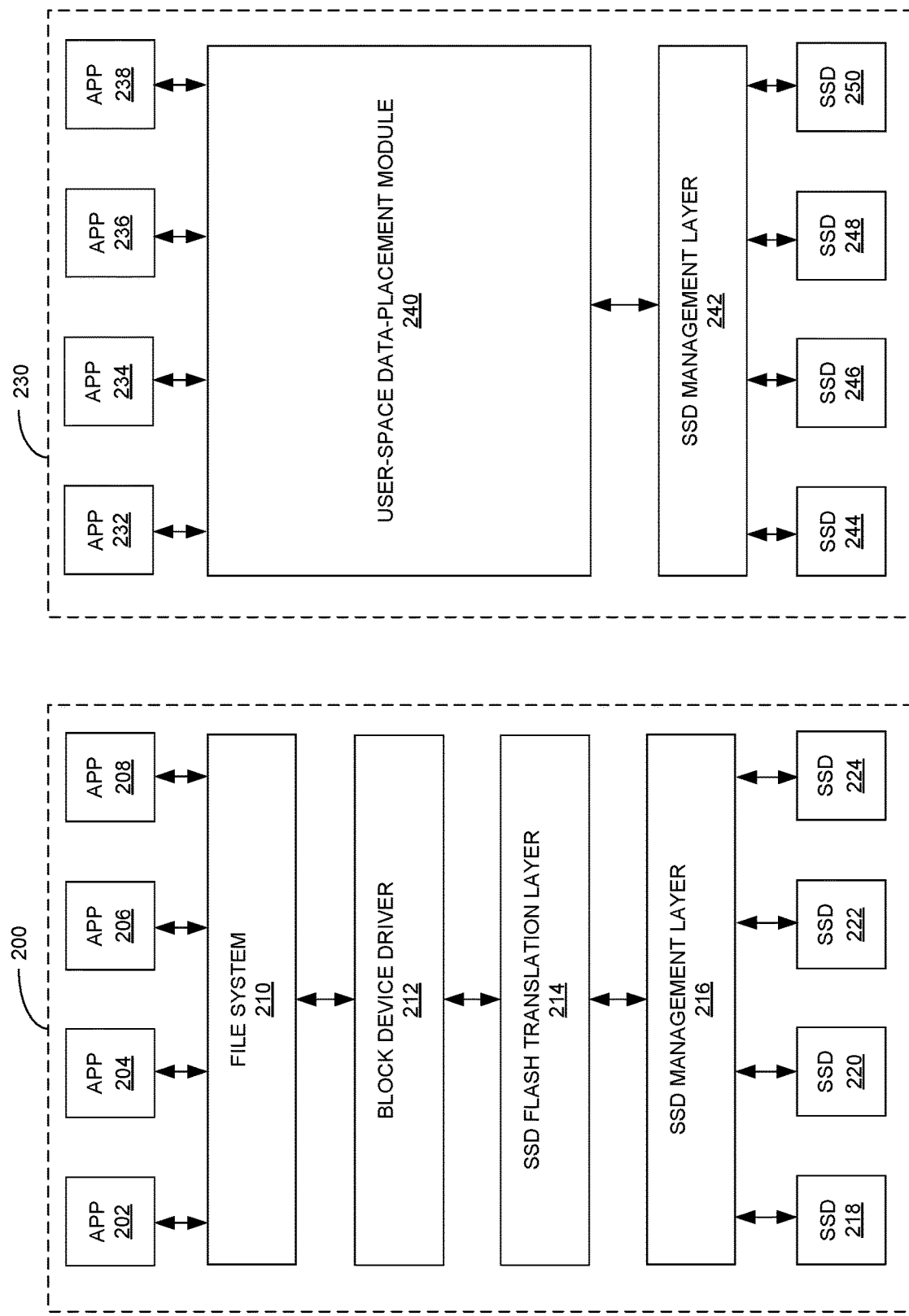
FIG. 2 illustrates a diagram comparing the I/O paths between a conventional SSS system and the invented SSS system, according to one embodiment.

FIG. 2 illustrates a diagram comparing the I/O paths between a conventional SSS system and the invented SSS system, according to one embodiment. The left drawing of FIG. 2 shows the I/O path of a conventional SSS system 200. In conventional SSS system 200, a number of user applications (e.g., user applications 202, 204, 206, and 208) are coupled to file system 210, which handles naming of the files and determines where the files are placed logically for storage and retrieval. More specifically, file system 210 can allocate the logical extents that cover the continuous logical space. File system 210 couples to block device driver 212, which can map a logical extent to multiple logic block addresses (LBAs). Block device driver 212 couples to SSD flash translation layer (FTL) 214, which can map the LBAs to physical block addresses (PBAs). The data and the PBAs can then be sent to SSD management layer (e.g., SSD controller) 216, which can write the data onto the SSDs (e.g., SSDs 218-224) based on the corresponding PBAs.

The right drawing of FIG. 2 shows the I/O path of a novel SSS system having a user-space data-placement layer. In novel SSS system 230, a number of applications (e.g., user applications 232, 234, 236, and 238) can be coupled to user-space data-placement module 240, which can be responsible for receiving application storage requests and mapping the received data to physical locations in the SSDs. More specifically, user-space data-placement module 240 can combine the functions of a number of modules in conventional SSS system 200, including file system 210, block device driver 212, and SSD FTL 214. User-space data-placement module 240 can send data and the mapped PBAs to SSD management layer 242, which can write the data onto the SSDs (e.g., SSDs 244-250) based on the PBAs. In some embodiments, user-space data-placement module 240 can be implemented in the user space and can have a much simpler structure compared to the various modules of conventional SSS system 200.

Figure 3:
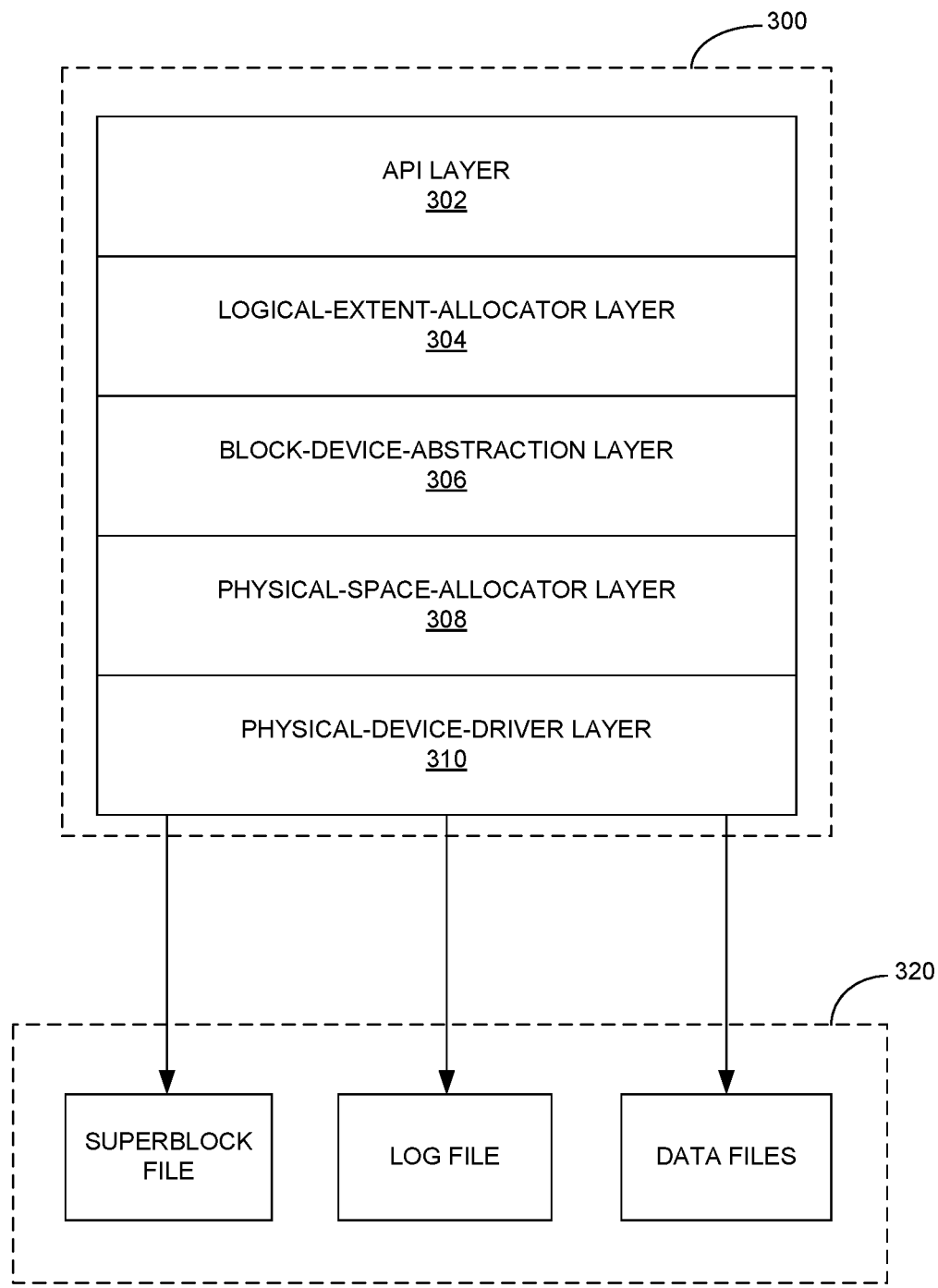
FIG. 3 shows an exemplary structure of the user-space data-placement layer, according to one embodiment.

FIG. 3 shows an exemplary structure of the user-space data-placement layer, according to one embodiment. User-space data-placement layer 300 can include a number of sub-layers, including an API layer 302, a logical-extent-allocator layer 304, a block-device-abstraction layer 306, a physical-space-allocator layer 308, and a physical-device-driver layer 310.

API layer 302 can provide an interface to various user applications. More specifically, API layer 302 can adapt standard storage requests from applications for various routine operations, including but not limited to: read, write, flush, fsync, remove, etc., to requests that are suitable to the invented storage system. Logical-extent-allocator layer 304 can be responsible for assigning continuous logical space to hold data accumulated at API layer 302. For example, at logical-extent-allocator layer 304, a continuous logical extent can be assigned to a to-be-written user data file.

At block-device-abstraction layer 306, each continuous logical extent can be divided into a number of smaller units, which can be a multiple of the unit size of the physical SSD. In the example shown in FIG. 3, the physical SSD coupled to user-space data-placement layer 300 can be an NAND flash drive 320, and each continuous logical extent can be divided into smaller units, with each smaller unit having a size that is a multiple of the page size of NAND flash drive 320. For example, a typical page size of an NAND flash drive can be 4 KB, and the logical extend can be divided into smaller units having a size of a multiple of 4 KB (e.g., 100 KB). At physical-space-allocator layer 308, each smaller logical unit can be assigned to multiple physical pages, and a mapping between the smaller logical units and the physical pages in NAND flash drive 320 can be established and maintained. SSD media management can be handled by physical-device-driver layer 310. Depending on the storage type, specific operations can be performed. If the SSD is a NAND flash drive (e.g., NAND flash drive 320), physical-device-driver layer 310 can perform a number of NAND-specific operations, including but not limited to: parity check, garbage collection, read disturb handling, bad block replacement, etc. As in conventional SSD systems, data-intensive operations (e.g., error-correction operations based on ECC correction or RAISE) can be handled by the SSD controller.

In some embodiments, three types of files can be written into the physical SSD (e.g., NAND flash drive 320), including the superblock file, the log file, and the data files. The log file and the data files can be written into the NAND flash drive in an appending manner. The superblock file can refer to the record of the characteristics of a file system, including its size, the block size, the empty blocks and count, the filled blocks and count, the size and location of the inode tables, the disk block map and usage information, and the size of the block groups. Unlike the log file and the data files, the superblock file can be updated immediately. Note that, although NAND flash drive 320 does not support in-place updates, when a superblock file is updated, it can be written into a new physical location and the LBA-to-PBA mapping can be updated immediately. The old superblock file, which is page-aligned, can be deleted to release the physical location for new data. There is no need for garbage collection here.

The SSD-access operations can include two basic types, the host operations and the background operations. The host operations can include the host read and write operations, and the background operations can include GC operations and read-disturb-handling operations. Read disturb refers to a scenario where reading one group of cells in the NAND flash memory can cause nearby cells in the same memory block to change over time. To handle the read disturb problem, the SSD controller will typically count the total number of reads to a block since the last erase. When the count exceeds a target limit, the affected block is copied over to a new block, erased, and then released to the block pool.

Figure 4A:
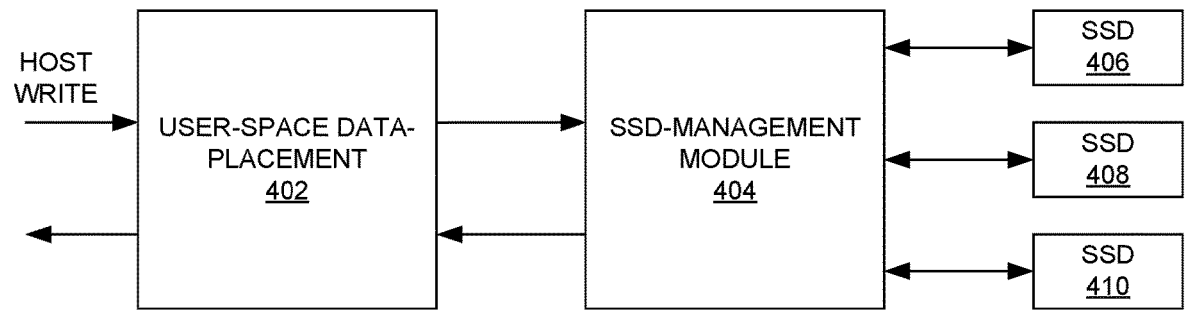
FIG. 4A illustrates exemplary host-access processes, according to one embodiment.

FIG. 4A illustrates exemplary host-access processes, according to one embodiment. More specifically, FIG. 4A shows the paths of the host-write and the host-read operations. In the example shown in FIG. 4A, user-space data-placement layer 402 can receive host-write commands from applications and perform various operations (e.g., logical-extent allocation and LBA-to-PBA mapping) before sending the data and the PBAs to SSD-management module 404, which can then store the data into one or more SSDs (e.g., SSDs 406, 408, and 410). Each write operation can include multiple folds of program-and-verify operations. Note that the program operation refers to the process of applying voltages to the memory cells (e.g., a word line), and the verification operation refers to the process of reading back the data using "weak" read.

In certain scenarios, uncorrectable error may occur during the verification stage. In such cases, true data is still held in the data buffer. In response to detecting the uncorrectable errors, user-space data-placement layer 402 can modify the write by writing data (now obtained from the data buffer) to another physical location. For example, the physical-space allocator module in the user-space data-placement layer 402 can allocate a different physical location for writing the data. For uncorrectable error occurring at multiple locations or repeated occurrence of errors, this process can repeat itself until the write operation is successfully completed.

For host-read operations, user-space data-replacement layer 402 receives data from SSD-management module 404 and returns the data to the requesting applications. More specifically, host-read operations need to be handled immediately. During read, any uncorrectable error can be treated as one copy failure, and consequently, the requested data can be retrieved from another replica on a different node to serve the host application. In addition, the failed copy can be refreshed using true data retrieved from the replica to repair the uncorrectable error, without the need to bring the SSD offline.

Figure 4B:
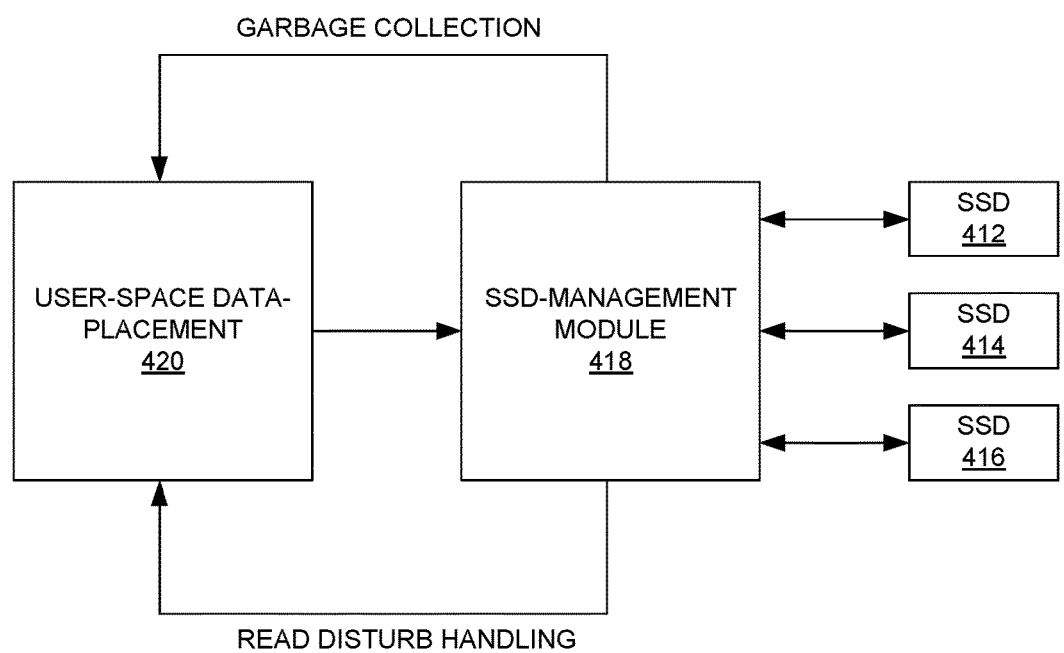
FIG. 4B illustrates exemplary background-access processes, according to one embodiment.

FIG. 4B illustrates exemplary background-access processes, according to one embodiment. More specifically, FIG. 4B shows the paths of various background operations, including garbage collection and read-disturb handling. In the example shown in FIG. 4B, various background operations can also access the SSDs, such as SSDs 412, 414, and 416. More specifically, the garbage collection and read-disturb handling can be initialized by SSD-management module 418. The directions of the background read and write operations can be similar to those of the host read and write operations. For example, during background read, SSD-management module 418 reads data from the SSDs before sending the data to user-space data-replacement layer 420. On the other hand, during background write, user-space data-replacement layer 420 sends the to-be-written data (e.g., valid data in the case of garbage collection) to SSD-management module 418, which writes the data into the SSDs. These background accesses occur in the SSDs in an asynchronous manner with the host accesses (e.g., host reads and writes), and special care is needed to prevent data loss.

In some embodiments, to avoid data loss, any occurrence of uncorrectable error can be reported immediately to the user-space data-placement layer, which can mark the corresponding page as unavailable, retrieve a replica of the corrupted data from other storage locations, and then use the retrieved data to replace the corrupted data in the original drive. When an error is detected during a write operation (e.g., during a host write or a background write operation), handling the error can often involve writing the data to a new physical location.

Figure 5A:
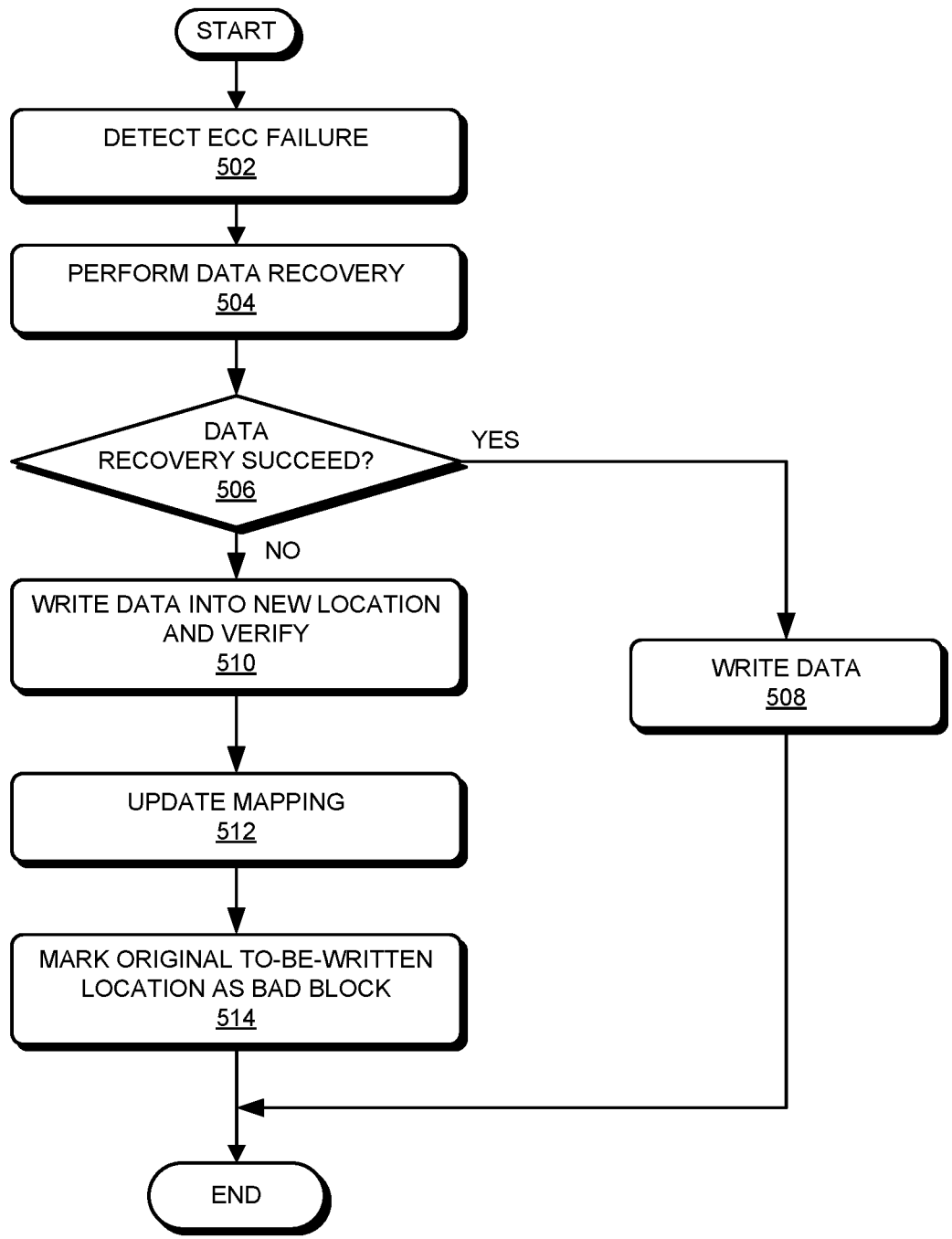
FIG. 5A presents a flowchart illustrating an exemplary process for handling uncorrectable errors during a host-write process, according to one embodiment.

FIG. 5A presents a flowchart illustrating an exemplary process for handling uncorrectable errors during a host-write process, according to one embodiment. During operation, the system can detect an ECC failure while writing data to the SSD (operation 502). For example, the system may detect the ECC failure during the verification step of the write operation. In response to the ECC failure, the system performs a data-recovery operation (e.g., using RAISE to recover the corrupted data) (operation 504) and determines whether the data-recovery operation succeeds (operation 506). Note that the ECC and the RAISE-based data recovery can be handled by the SSD controller.

If the data-recovery operation succeeds, the system finishes writing the data at the desired location (operation 508) and ends the host-write operation. Otherwise, the system writes the data into a new location on the SSD and verifies that the data is correctly written (operation 510). Subsequent to writing the data, the system updates the mapping (e.g., the LBA-to-PBA mapping) (operation 512) and marks the original to-be-written location as a bad block (operation 514). In some embodiments, a custom-designed data-placement layer can be used for selecting a new physical location for writing the data and for updating the LBA-to-PBA mapping. The SSD controller can be responsible for writing the data to the new location and verifying the written data.

Figure 5B:
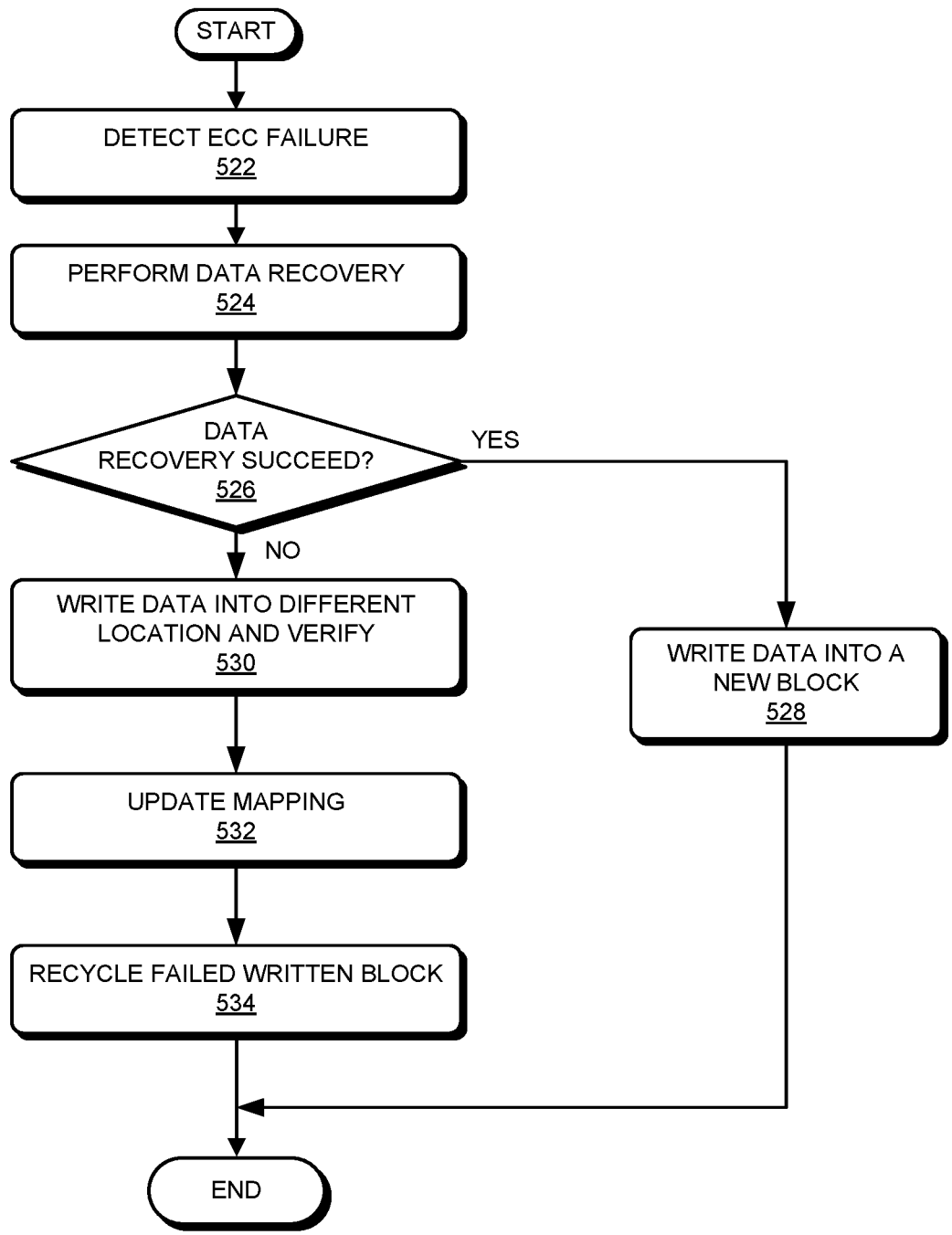
FIG. 5B presents a flowchart illustrating an exemplary process for handling uncorrectable errors during a background-write process, according to one embodiment.

FIG. 5B presents a flowchart illustrating an exemplary process for handling uncorrectable errors during a background-write process, according to one embodiment. For example, during garbage collection, the system may need to move the valid data from a to-be-recycled block into a new block. During operation, the system can detect an ECC failure when writing valid data into a new block in the SSD (operation 522). In response to the ECC failure, the system performs a data-recovery operation (e.g., using RAISE to recover the corrupted data) (operation 524) and determines whether the data-recovery operation succeeds (operation 526).

If the data-recovery operation succeeds, the system writes the recovered data to the new block (operation 528) and ends the background-write operation. Otherwise, the system writes the valid data into another physical location on the SSD and verifies that the data is correctly written (operation 530). Subsequent to writing the data, the system updates the mapping (e.g., the LBA-to-PBA mapping) (operation 532) and recycles the failed written block (operation 534).

Figure 6:
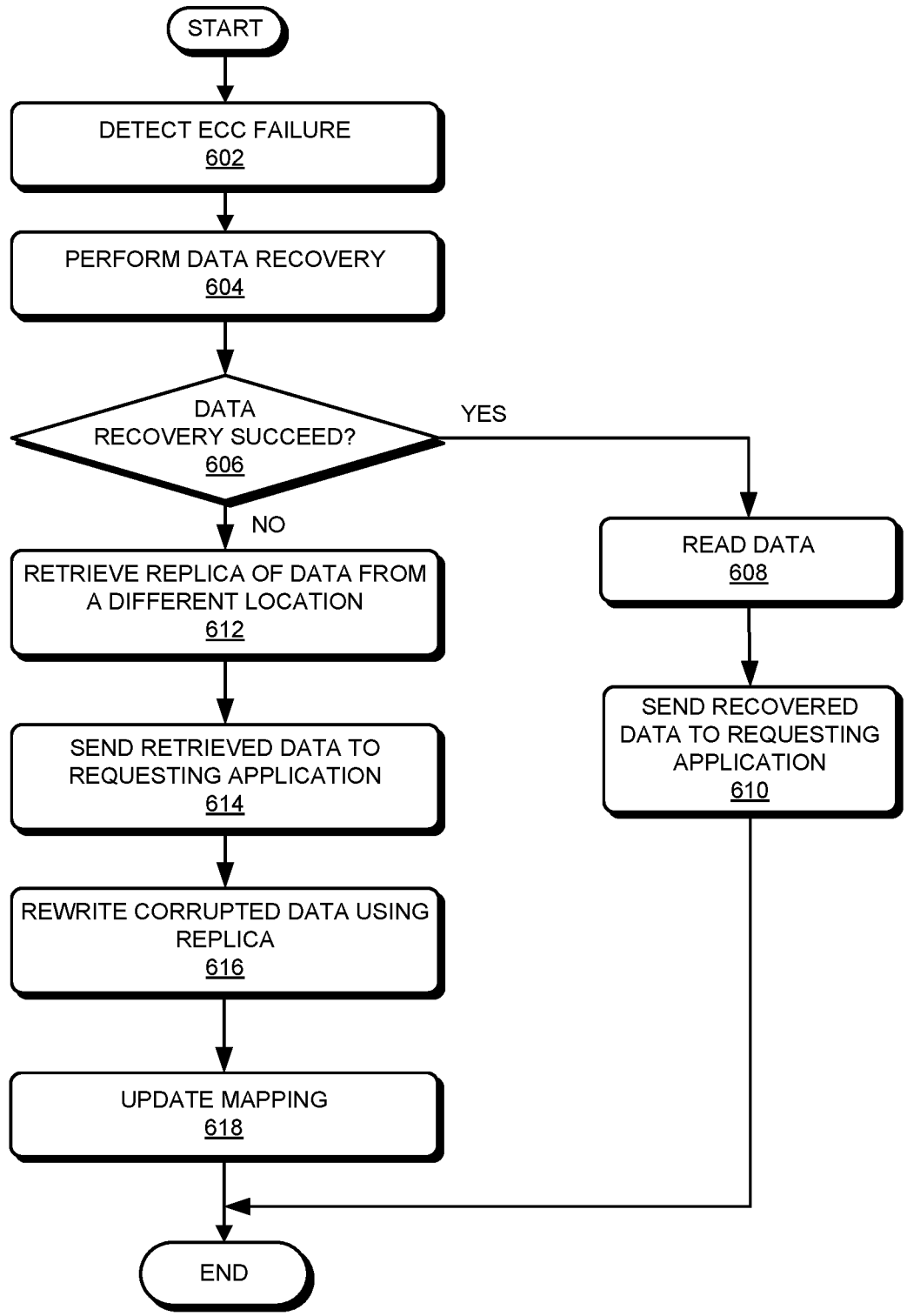
FIG. 6 presents a flowchart illustrating an exemplary process for handling uncorrectable errors during a host-read process, according to one embodiment.

When uncorrectable errors are detected during read accesses, the error-handling process can be more complicated. FIG. 6 presents a flowchart illustrating an exemplary process for handling uncorrectable errors during a host-read process, according to one embodiment. During operation, the system detects an ECC failure while performing a host-read operation (operation 602). For example, the SSD controller can detect the ECC failure in the to-be-read data. In response to the ECC failure, the system performs a data-recovery operation on the to-be-read data (e.g., using RAISE to recover the corrupted data) (operation 604) and determines whether the data-recovery operation succeeds (operation 606). If the RAISE-based data recovery succeeds, the system reads recovered data from the SSD (operation 608) and sends the recovered data to the host application requesting the data (operation 610). Otherwise, the system can retrieve a replica of the data from a different location (e.g., a different storage node within the hyperscale infrastructure) (operation 612) before sending the retrieved data to the requesting host application (operation 614). In some embodiments, the replica data can be retrieved, with the highest priority, from other nodes in the hyperscale storage infrastructure. The system can further use the retrieved replica data to rewrite the original to-be-read, corrupted data (operation 616) and updates the data mapping (e.g., the LBA-to-PBA mapping) (operation 618). More specifically, the retrieved replica data can be written into a different location into the same SSD, because the previous location may have corrupted cells and the associated storage block can been marked as a bad block. This way, the SSD can be repaired online. Compared to conventional approaches where an SSD with corrupted data need to be brought offline to be replaced, the current approach is more efficient and cost effective.

During garbage collection or read-disturb handling, pages with uncorrectable errors need to be copied to a new location (e.g., a destination block) because the original block is to be recycled. For example, the system may open a destination block for copying valid data from the to-be-recycled block. However, the valid data may contain uncorrectable errors and true or correct data may not be immediately available, making moving these pages a challenge. In some embodiments, before the true data is retrieved, the system (e.g., the user-space data-placement layer) may write dummy data into empty pages within the destination block in order to close the open destination block. Moreover, when all pages in the to-be-recycled block are invalid, the system can mark this block as a bad block, which prevents it from being used in the future.

When writing the dummy data in to the destination pages, the dummy data needs to be marked (e.g., in the out-of-band (OOB) area of the pages) as being incorrect. For example, the data-incorrect flag in the OOB area of the page can be marked. Moreover, the system can also mark the data-incorrect flag for the data entry in the LBA-to-PBA mapping table. The data-incorrect flag in the OOB area of the page and the mapping table can prevent the dummy data being read as real data by a host read process. More specifically, when a host read attempts to read this data before the uncorrectable error is fixed, the data-placement layer can see the data-incorrect flag in the mapping table or the OOB area of the pages. As a result, the data-placement layer can respond to the host read by requesting the data from a different location.

The system can request the true data (i.e., the correct data) from different physical locations (e.g., other nodes in the hyperscale storage infrastructure). Upon retrieving the true data, the system can write the retrieved data into another physical location and update the LBA-to-PBA mapping based on the new physical location. The system can further remove the data-incorrect flag in the mapping table and invalidate the physical page(s) where errors occur.

Figure 7:
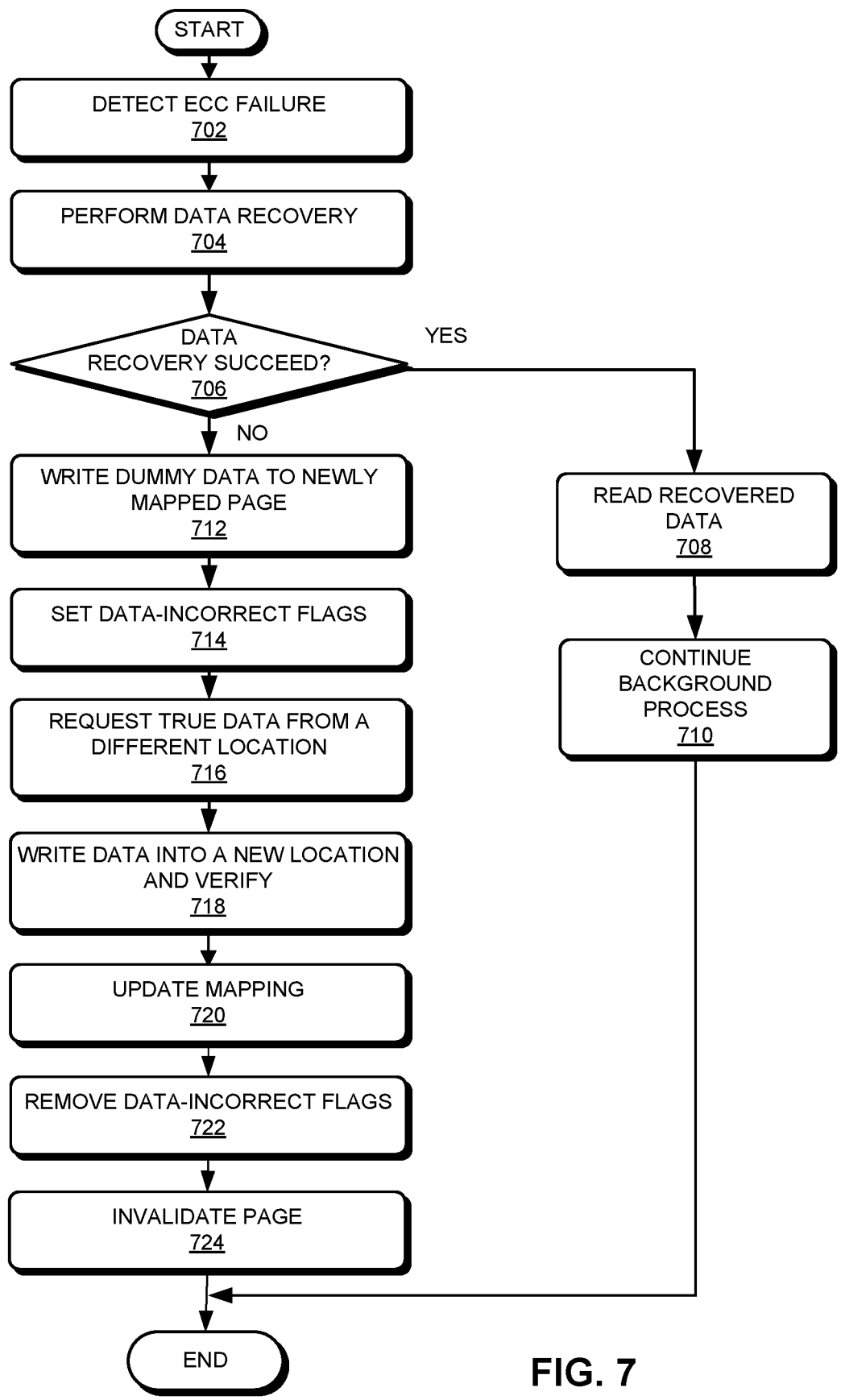
FIG. 7 presents a flowchart illustrating an exemplary process for handling uncorrectable errors during a background-read process, according to one embodiment.

FIG. 7 presents a flowchart illustrating an exemplary process for handling uncorrectable errors during a background-read process, according to one embodiment. During operation, the system detects an ECC failure while performing a background-read operation (operation 702). For example, the SSD controller can detect an ECC failure during the read cycle of a garbage collection operation. In response to the ECC failure, the system performs a data-recovery operation on the to-be-read data (e.g., using RAISE to recover the corrupted data) (operation 704) and determines whether the data-recovery operation succeeds (operation 706). If the RAISE-based data recovery succeeds, the system reads recovered data (operation 708) and continues the current background process (operation 710).

In response to determining that the data-recovery operation fails, the system writes dummy data into the newly mapped page (e.g., a new block allocated for garbage collection) in order to close the open block (operation 712). This is because the true data may be temporarily unavailable. To prevent the dummy data being read by a host-read access as real data, the data-placement layer needs to set the data-incorrect flag in both the mapping table and the page header (operation 714). In some embodiments, the page header can be located at the 00B area of the page. Setting the data-incorrect flag can ensure that an asynchronous host read access can be responded to by retrieving data from a different location.

The system can further request true data from a different physical location (e.g., a different node in the hyperscale infrastructure) (operation 716). The system can write the retrieved data into a new physical location and can verify that the data is correctly written (operation 718). Note that if the verification fails, the system can select different new physical locations for writing the data until the write operation succeeds.

After correctly writing the data, the data-placement layer updates the mapping table (e.g., the LBA-to-PBA mapping table) using the address of the new physical location (operation 720) and removes the data-incorrect flags in the page header and the mapping table (operation 722). The data-placement layer may further invalidate the original physical page (i.e., page where the uncorrectable error occurs) for future recycle (operation 724).

In general, embodiments of the present invention provide a solution for enhancing the error-handling capability of an SSD storage system. By implementing a data-placement layer in the user space, any uncorrectable error (e.g., an error that cannot be corrected by the ECC and RAISE-based data recovery) in the SSDs can be detected and handled instantaneously, regardless of whether the error is detected during a host-access process or a background-access process, or whether the error is detected during a write or a read process. More specifically, the user-space data-placement layer can mark the page(s) containing the uncorrectable error as being temporarily unavailable (e.g., by setting the data-incorrect flag in the OOB area of the page(s). If the error is detected during the verification step of a write access, the data-placement layer can write the data into a new location and update the mapping table. If the error is detected during a read access, the data-placement layer can retrieve a replica of the corrupted data from a different location and return the retrieved data to the requesting application or the background read process. The data-placement layer can further fix the SSD with the uncorrectable error using the retrieved copy of the true data and mark the SSD block where the error occurs as a bad block. This way, there is no longer the need to replace the entire disk drive.

Figure 8:
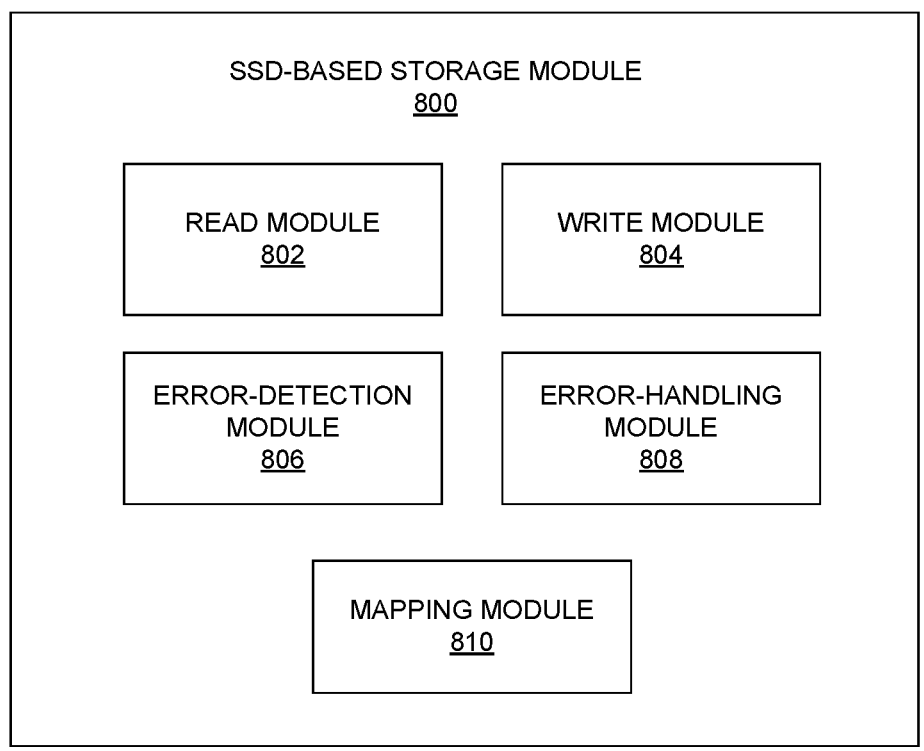
FIG. 8 illustrates an exemplary solid-state drive (SSD)-based storage module, according to one embodiment.

FIG. 8 illustrates an exemplary SSD-based storage module, according to one embodiment. In some embodiments, SSD-based storage module 800 can include a read module 802 and a write module 804. Read module 802 can be responsible for handling the read operations, including both the host read and the background read. Write module 804 can be responsible for handling the write operations, including both the host write and the background write.

SSD-based storage module 800 can also include an error-detection module 806 and an error-handling module 808. Error-detection module 806 can be responsible for detecting uncorrected errors (e.g., errors that cannot be corrected by conventional ECC and data recovery schemes) in the SSD. Error-handling module 808 can be responsible for handling the uncorrectable errors. For write errors, error-handling module 808 can write data to a different location. For read errors, error-handing module 808 can obtain a replica of the correct data from a different storage node. Error-handling module 808 can also update the mapping table managed by mapping module 810.

Figure 9:
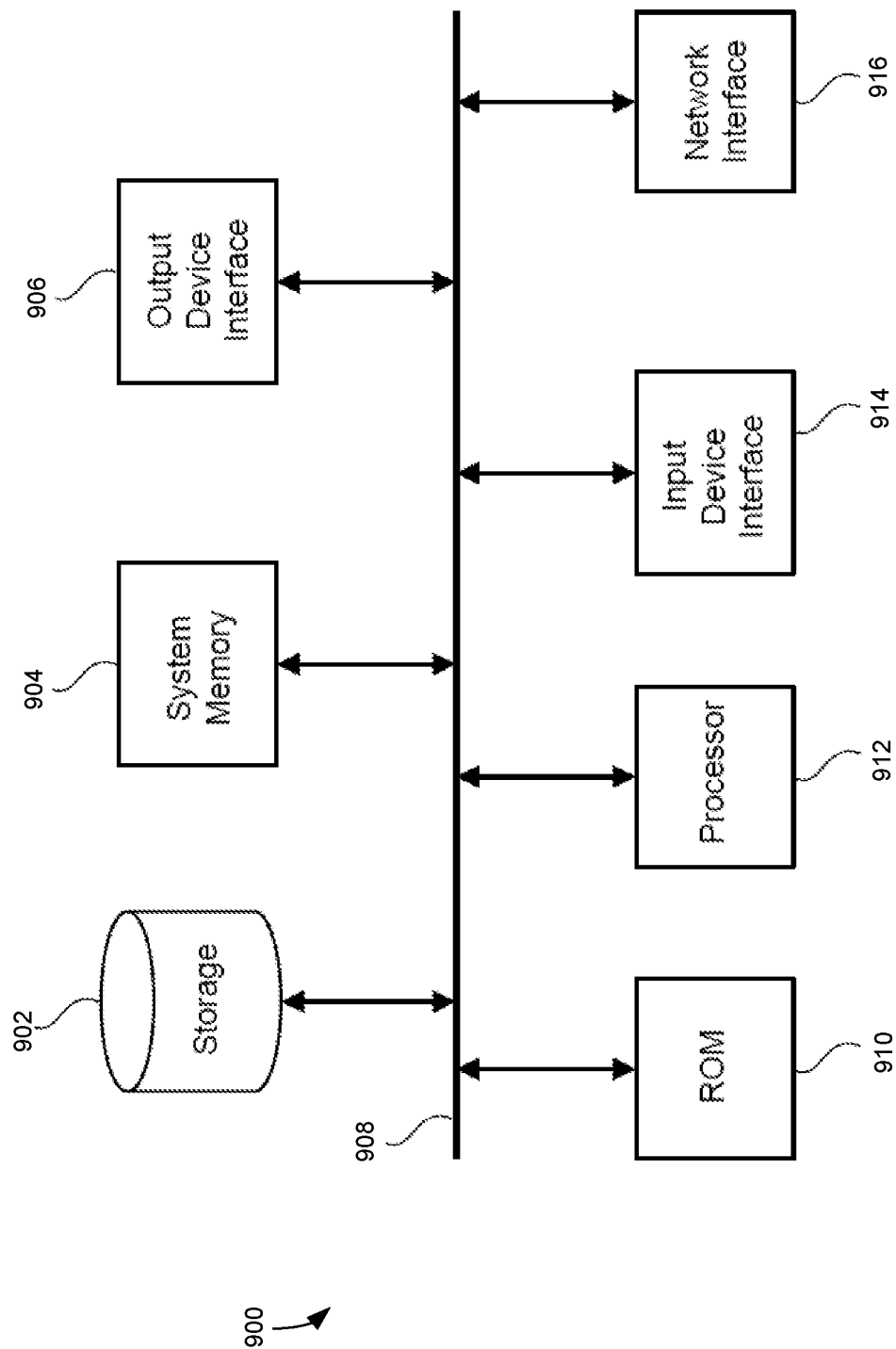
FIG. 9 conceptually illustrates an electronic system with which the subject technology is implemented, according to one embodiment.

FIG. 9 conceptually illustrates an electronic system with which the subject technology is implemented, according to one embodiment. Electronic system 900 can be a client, a server, a computer, a smartphone, a PDA, a laptop, or a tablet computer with one or more processors embedded therein or coupled thereto, or any other sort of electronic device. Such an electronic system includes various types of computer-readable media and interfaces for various other types of computer-readable media. Electronic system 900 includes a bus 908, processing unit(s) 912, a system memory 904, a read-only memory (ROM) 910, a permanent storage device 902, an input device interface 914, an output device interface 906, and a network interface 916.

Bus 908 collectively represents all system, peripheral, and chipset buses that communicatively connect the numerous internal devices of electronic system 900. For instance, bus 908 communicatively connects processing unit(s) 912 with ROM 910, system memory 904, and permanent storage device 902.

From these various memory units, processing unit(s) 912 retrieves instructions to execute and data to process in order to execute the processes of the subject disclosure. The processing unit(s) can be a single processor or a multi-core processor in different implementations.

ROM 910 stores static data and instructions that are needed by processing unit(s) 912 and other modules of the electronic system. Permanent storage device 902, on the other hand, is a read-and-write memory device. This device is a non-volatile memory unit that stores instructions and data even when electronic system 900 is off. Some implementations of the subject disclosure use a mass-storage device (such as a magnetic or optical disk and its corresponding disk drive) as permanent storage device 902.

Other implementations use a removable storage device (such as a floppy disk, flash drive, and its corresponding disk drive) as permanent storage device 902. Like permanent storage device 902, system memory 904 is a read-and-write memory device. However, unlike storage device 902, system memory 904 is a volatile read-and-write memory, such as a random-access memory. System memory 904 stores some of the instructions and data that the processor needs at runtime. In some implementations, the processes of the subject disclosure are stored in system memory 904, permanent storage device 902, and/or ROM 910. From these various memory units, processing unit(s) 912 retrieves instructions to execute and data to process in order to execute the processes of some implementations.

Bus 908 also connects to input and output device interfaces 914 and 906. Input device interface 914 enables the user to communicate information and send commands to the electronic system. Input devices used with input device interface 914 include, for example, alphanumeric keyboards and pointing devices (also called "cursor control devices"). Output device interface 906 enables, for example, the display of images generated by the electronic system 900. Output devices used with output device interface 906 include, for example, printers and display devices, such as cathode ray tubes (CRT) or liquid crystal displays (LCD). Some implementations include devices such as a touchscreen that function as both input and output devices.

Finally, as shown in FIG. 9, bus 908 also couples electronic system 900 to a network (not shown) through a network interface 916. In this manner, the computer can be a part of a network of computers (such as a local area network ("LAN"), a wide area network ("WAN"), an intranet, or a network of networks, such as the Internet. Any or all components of electronic system 900 can be used in conjunction with the subject disclosure.

These functions described above can be implemented in digital electronic circuitry, or in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for handling errors in a storage system, the method comprising:
   detecting, by a data-placement module of the storage system, an error occurring at a first physical location within the storage system;
   in response to determining that the error occurs during a write access, writing to-be-written data into a second physical location within the storage system;
   updating a mapping between a logical address and a physical address associated with the to-be-written data;
   in response to determining that the error occurs during a read access that belongs to a background process,
      determining a destination physical location associated with to-be-read data based on a current mapping table,
      writing dummy data into the destination physical location and
      indicating, by setting a data-incorrect flag, in a mapping table entry associated with the to-be-read data that current data stored at the destination physical location is incorrect;
   retrieving a copy of the to-be-read data from a second storage system; and
   serving the read access using the retrieved copy.

2. The computer-implemented method of claim 1, wherein the storage system is based on solid-state drives (SSDs), and wherein the SSD-based storage system comprises a plurality of not-and (NAND) flash drives.

3. The computer-implemented method of claim 1, further comprising:
   in response to determining that the error occurs during a read access belongs to a host process, serving the read access by returning the retrieved copy to an application requesting the to-be written data.

4. The computer-implemented method of claim 1, wherein the background process comprises a garbage collection process or a read-disturb handling process.

5. The computer-implemented method of claim claim 1, further comprising:
   subsequent to retrieving the copy, writing the copy to a second destination physical location; and
   updating the mapping table entry associated with the to-be-read data using a physical address of the second destination physical location.

6. The computer-implemented method of claim 1, wherein updating the mapping table entry further comprises unsetting the data-incorrect flag.

7. The computer-implemented method of claim 1, further comprising:
   subsequent to retrieving the copy, repairing a storage drive within the storage system, within which the error occurs, using the retrieved copy without bringing the storage drive offline.

8. The computer-implemented method of claim 1, wherein detecting the error further comprises:
   in response to receiving an error correction coding (ECC) error, initiating a data recovery operation; and
   detecting the error in response to determining that the data recovery operation fails.

9. A storage system, comprising:
   a plurality of storage drives; and
   a data-placement module coupled to the storage drives, wherein the data-placement module is configured to:
      detect an error occurring at a first physical location within the storage drives;
      in response to determining that the error occurs during a write access, write to-be-written data into a second physical location within the storage drives;
      update a mapping between a logical address and a physical address associated with the to-be-written data;
      in response to determining that the error occurs during a read access that belongs to a background process,
         determine a destination physical location associated with to-be-read data based on a current mapping table,
         write dummy data into the destination physical location, and
         indicate, by setting a data-incorrect flag, in a mapping table entry associated with the to-be-read data that current data stored at the destination physical location is incorrect;
      retrieve a copy of the to-be-read data from a second storage system; and
      serve the read access using the retrieved copy.

10. The storage system of claim 9, wherein the storage drives comprise a plurality of not-and (NAND) flash drives.

11. The storage system of claim 9, wherein the data-placement module is further configured to:
    in response to determining that the error occurs during a read access belongs to a host process, serve the read access by returning the retrieved copy to an application requesting the to-be written data.

12. The storage system of claim 9, wherein the background process comprises a garbage collection process or a read-disturb handling process.

13. The storage system of claim 9, wherein the data-placement module is further configured to:
    write the copy into a second destination physical location subsequent to retrieving the copy; and
    update the mapping table entry associated with the to-be-read data using a physical address of the second destination physical location.

14. The storage system of claim 9, wherein while updating the mapping table entry, the data-placement layer is further configured to unset the data-incorrect flag.

15. The storage system of claim 9, wherein the data-placement layer is further configured to:
    subsequent to retrieving the copy, repair a storage drive within the storage system, within which the error occurs, using the retrieved copy without bringing the storage drive offline.

16. The storage system of claim 9, wherein while detecting the error, the data-placement module is further configured to:

in response to receiving an error correction coding (ECC) error, initiate a data recovery operation; and detect the error in response to determining that the data recovery operation fails.

17. The storage system of claim 9, wherein the data-placement module resides in a user space, and wherein the data-placement module is further configured to:

interface with application to receive to-be written data;
allocate logic extents for the to-be-written data; and
map the logic extents to physical locations.

* * * * *

UNITED STATES PATENT AND TRADEMARK OFFICE
CERTIFICATE OF CORRECTION

PATENT NO. : 10,769,018 B2  
APPLICATION NO. : 16/209319  
DATED : September 8, 2020  
INVENTOR(S) : Shu Li Page 1 of 1

It is certified that error appears in the above-identified patent and that said Letters Patent is hereby corrected as shown below:

In the Claims

Column 11, Line 56 should read "The computer-implemented method of claim 1".

Signed and Sealed this  
Fifteenth Day of December, 2020

Andrei Iancu  
*Director of the United States Patent and Trademark Office*